(12) United States Patent
Hill

(10) Patent No.: US 6,842,256 B2
(45) Date of Patent: Jan. 11, 2005

(54) COMPENSATING FOR EFFECTS OF VARIATIONS IN GAS REFRACTIVITY IN INTERFEROMETERS

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 248 days.

(21) Appl. No.: 10/294,158

(22) Filed: Nov. 14, 2002

(65) Prior Publication Data

US 2003/0151750 A1 Aug. 14, 2003

Related U.S. Application Data

(60) Provisional application No. 60/335,963, filed on Nov. 15, 2001.

(51) Int. Cl.[7] .................................................. G01B 9/02
(52) U.S. Cl. ........................................ 356/517; 356/500
(58) Field of Search ................................... 356/517, 500

(56) References Cited

U.S. PATENT DOCUMENTS

| | | | |
|---|---|---|---|
| 5,877,843 A | 3/1999 | Takagi et al. | |
| 5,991,033 A | 11/1999 | Henshaw et al. | |
| 6,417,927 B2 * | 7/2002 | de Groot | 356/517 |
| 2002/0048026 A1 | 4/2002 | Isshiki et al. | |
| 2003/0128369 A1 * | 7/2003 | Hill | 356/517 |

* cited by examiner

Primary Examiner—Gregory J. Toatley, Jr.
Assistant Examiner—Patrick Connolly
(74) Attorney, Agent, or Firm—Fish & Richardson P.C.

(57) ABSTRACT

Methods and system for compensating for effects of changes and variations of gas refractivity in a measurement and/or reference beam path of an interferometer are disclosed.

40 Claims, 9 Drawing Sheets

COMPENSATING FOR EFFECTS OF VARIATIONS IN GAS REFRACTIVITY IN INTERFEROMETERS

CROSS-REFERENCE TO RELATED APPLICATIONS

This application claims priority to Provisional Patent Application 60/335,963, entitled "COMPENSATION FOR EFFECTS OF STATIONARY NON-RANDOM CHANGES AND STATIONARY RANDOM FLUCTUATIONS IN REFRACTIVITY OF GAS IN INTERFEROMETERS," to Henry Hill, and filed Nov. 15, 2001.

BACKGROUND

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam splitter to direct the measurement and reference beams to the measurement and reference objects, respectively, and combine the reflected measurement and reference beams to form overlapping exit measurement and reference beams. The overlapping exit beams form an output beam that subsequently passes through a polarizer.

The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2 vnp/\lambda$, where $v$ is the relative speed of the measurement and reference objects, $\lambda$ is the wavelength of the measurement and reference beams, $n$ is the refractive index of the medium through which the light beams travel, e.g., air or vacuum, and $p$ is the number of passes to the reference and measurement objects. Changes in the relative position of the measurement object correspond to changes in the phase of the measured interference signal, with a $2\pi$ phase change substantially equal to a distance change $L$ of $\lambda/(np)$, where $L$ is a round-trip distance change, e.g., the change in distance to and from a stage that includes the measurement object.

Unfortunately, this equality is not always exact. In addition, the amplitude of the measured interference signal may be variable. A variable amplitude may subsequently reduce the accuracy of measured phase changes. Many interferometers include non-linearities such as what are known as "cyclic errors." The cyclic errors can be expressed as contributions to the phase and/or the intensity of the measured interference signal and have a sinusoidal dependence on the change in optical path length pnL. In particular, the first harmonic cyclic error in phase has a sinusoidal dependence on $(2\pi pnL)/\lambda$ and the second harmonic cyclic error in phase has a sinusoidal dependence on $2(2\pi pnL)/\lambda$. Higher harmonic cyclic errors can also be present.

Another source of errors are related to environmental effects such as air turbulence. See, for example, an article entitled "Residual Errors In Laser Interferometry From Air Turbulence And Nonlinearity," by N. Bobroff, *Appl. Opt.* 26(13), 2676–2682 (1987), and an article entitled "Recent Advances In Displacement Measuring Interferometry," also by N. Bobroff, *Measurement Science & Tech.* 4(9), 907–926 (1993). As noted in the aforementioned cited references, interferometric displacement measurements in a gas are subject to environmental uncertainties, particularly to changes in air pressure and temperature; to uncertainties in air composition such as resulting from changes in humidity; and to the effects of turbulence in the gas. Such factors alter the wavelength of the light used to measure the displacement. Under normal conditions the refractive index of air for example is approximately 1.0003 with a variation of the order of $1\times10^{-5}$ to $1\times10^{-4}$. In many applications the refractive index of air must be known with a relative precision of less than 0.1 ppm (parts per million) to less than 0.001 ppm, these two relative precisions corresponding to a displacement measurement accuracy of 100 nm and less than 1 nm, respectively, for a one meter interferometric displacement measurement.

One way to detect refractive index fluctuations is to measure changes in pressure and temperature along a measurement path and calculate the effect on the optical path length of the measurement path. Another, more direct way to detect the effects of a fluctuating refractive index over a measurement path is by multiple-wavelength distance measurement. The basic principle may be understood as follows. Interferometers and laser radar measure the optical path length between a reference and an object, most often in open air. The optical path length is the integrated product of the refractive index and the physical path traversed by a measurement beam. In that the refractive index varies with wavelength, but the physical path is independent of wavelength, it is generally possible to determine the physical path length from the optical path length, particularly the contributions of fluctuations in refractive index, provided that the instrument employs at least two wavelengths. The variation of refractive index with wavelength is known in the art as dispersion and this technique is often referred to as the dispersion technique or as dispersion interferometry.

SUMMARY

The accuracy of interference measurements can be improved by measuring gas refractivity at the interferometer's measurement beam path, and compensating the interferometry measurement based on the measured refractivity. However, in many systems, it is not practical to place a refractometer or other means for measuring the gas refractivity at or nearby the measurement beam path. Often, a more practical approach is to measure the gas refractivity at some location remote from the interferometer's measurement beam path, where the refractometer and/or other hardware may be more easily accommodated. In a closed environment in equilibrium, the gas refractivity in the measurement beam path of the interferometer will be approximately equal to the refractivity measured at the remote location. In such cases, the interference measurement can be compensated by assuming the gas refractivity in the measurement beam path is the same as the measured value. However, interferometers are used for high-precision measurements in many systems where the atmosphere is rarely in equilibrium, and such a one-to-one mapping of the measured refractivity to the refractivity in the measurement beam path is not sufficiently accurate.

One example of where an interferometer is used for high-precision measurements is to monitor the position of components in a lithography system. During the operation of such a system, the gas environment can frequently change. For example, introducing new wafers into the system causes gas movement in the system, as does removing them after exposure. Scanning or stepping the wafer and/or reticle during an exposure cycle can also cause gas movement in the system. In addition, temperature changes during an exposure cycle can affect environmental parameters like humidity and density, which can both affect gas refractivity. Furthermore, at different stages during an exposure cycle, the chamber can be flushed with various process gases, further disrupting the system's environment.

Because of these and other influences, the density, composition, temperature, and/or pressure of gas in the system can vary. In addition, turbulence and variations in gas refractivity can occur at different times and at different locations in a lithography system during an exposure cycle. In such situations, compensating interferometric measurements using a simple one-to-one mapping of the gas refractivity in the measurement beam path to the gas refractivity at the remote location is not always sufficiently accurate. For example, in such situations, measuring a first value for the refractivity at a remote location at a first time during the exposure cycle may correspond to a certain refractivity in the measurement beam path. However, measuring the same value for the refractivity can correspond to a different value in the beam paths at some later time during the exposure cycle. Accurate measurements can be made, however, by compensating using a non-trivial function (e.g., more complex than a one-to-one correspondence) that maps the gas refractivity at the measurement beam path to a remote location where the refractivity is measured based on the system conditions at the time the refractivity was made.

Accordingly, in certain aspects, the present invention features an apparatus and method for compensating for effects of changes in refractivity of a gas in an interferometer's measurement beam path. Embodiments of the invention compensate for the effects by measuring the refractivity of the gas at some location remote from the measurement beam path and mapping the measured refractivity to the refractivity in the measurement beam path using a non-trivial function. In general, remote locations refer to locations where a one-to-one mapping is insufficient to relate the gas refractivity to the refractivity of gas in the measurement beam path. The non-trivial function can be used, along with the system conditions, to monitor the effects of periodic changes and the certain effects of random fluctuations in the refractivity of gas in the measurement beam path. Sources of changes in the gas refractivity include periodic and random changes to the gas density and/or periods of increased or decreased turbulence that occur during each of the system's cycles (e.g., the exposure cycle of a lithography system).

The non-trivial function relates the measured gas refractivity to gas refractivity in the measurement beam path based on the system conditions. For example, in a lithography system where the system's conditions change during an exposure cycle, the non-trivial function is parameterized according to the particular stage of the cycle. System conditions may include, for example, the position and/or angular orientation of the measurement object, the velocity at which the measurement object may be moving, and composition of the gas as a function of time.

The non-trivial function is established prior to compensating the interferometry measurements. The non-trivial function can be established using empirical methods, computational methods or a combination of empirical and computational methods.

In some embodiments, the system compensates the measured position of the stage in real time. These real-time corrected measurements can be used in downstream or contemporaneous applications. One example of a contemporaneous application is to use the interferometry system to measure the position of a stage that is continuously scanned during the measurement while compensating for effects of changes of the refractivity of gas in the measurement beam path.

In preferred embodiments, compensating an interferometric measurement for the effect of periodic changes and certain effects of random fluctuations in refractivity of the gas may be achieved substantially simultaneously.

In some embodiments, the chamber housing the interferometry system may be designed to provide a known or well-understood relationship between gas refractivity at different locations within the chamber. This may permit compensation that is more accurate and/or allow the non-trivial function to be determined more easily.

In general, in a first aspect, the invention features a method for use during a photolithography exposure cycle. The method includes interferometrically measuring a position of a movable stage within a chamber housing a photolithography exposure system, monitoring a refractivity at a location remote from the interferometry measurement within the chamber, and correcting the interferometric position measurement of the stage based on the monitored refractivity and a non-trivial function mapping refractivity at the remote location to that near the interferometric measurement during different stages of the photolithography exposure cycle.

Embodiments of the invention can include one or more of the features described in regard to other aspects of the invention. Alternatively, or additionally, embodiments of the invention can include one or more of the following features.

The photolithography exposure cycle can cause atmospheric changes in the chamber. The method can include repeating the interferometric position measurement during these atmospheric changes. The method can also include correcting the repeated interferometric position measurements based on the monitored refractivity at the first location and the non-trivial function.

The method can include moving the movable stage during the photolithography exposure cycle. Alternatively, or additionally, the method can include introducing a gas into or exhausting a gas out of the chamber during the photolithography exposure cycle. In some embodiments, the method includes loading a wafer onto the movable stage or removing a wafer from the movable stage during the photolithography exposure cycle.

Interferometrically measuring the position of the movable stage can include directing a measurement beam between an interferometer and a measurement object, wherein at least one of the interferometer and the measurement object is attached to the movable stage. The method can also include measuring a wavelength of the measurement beam during the photolithography exposure cycle. The interferometric position measurement of the movable stage position can be corrected based on the wavelength measurement.

The non-trivial function can be determined empirically and/or from a computer model.

In a second aspect, the invention features a method, which includes interferometrically measuring a position of a movable object within a chamber, measuring a refractivity within the chamber at a first location within the chamber, and correcting the interferometric position measurement of the object based on the refractivity measurement at the first location and a non-trivial function mapping refractivity at the first location to that near the interferometry measurement.

Embodiments of the invention can include one or more of the features described in regard to other aspects of the invention. Alternatively, or additionally, embodiments of the invention can include one or more of the following features.

The chamber can house a photolithography exposure system. The photolithography system can support a reticle during the interferometric measurement.

The movable object can be a movable stage, which can support a wafer during the interferometric measurement. In embodiments where the movable object is a movable stage, interferometrically measuring the position of the movable stage can include monitoring changes in an optical path length between an interferometer and a measurement object, wherein at least one of the interferometer and the measurement object is attached to the movable stage.

The method can include measuring a wavelength of a measurement beam directed between the interferometer and the measurement object during the interferometric measurement. The interferometric position measurement of the object can be corrected based on the measured wavelength.

The first location can be a location remote from the interferometry measurement.

The non-trivial function can be a function that relates the refractivity of the atmosphere at the remote position to the refractivity of the atmosphere near the movable object during different stages of an exposure cycle of the photolithography system. In some embodiments, the non-trivial function is determined empirically. Alternatively, or additionally, the non-trivial function can be determined from a computer model.

In some embodiments, the chamber houses a beam writing system.

In a third aspect, the invention features a system including a movable stage housed in a chamber. The system also includes an interferometry system housed in the chamber. The interferometry system is configured to measure a position of the movable stage along a measurement path. The interferometry system includes a refractometer (e.g., an interferometric refractometer) configured to monitor a refractivity at a first location within the chamber. The system also includes a controller coupled to the interferometry system. During operation of the system, the controller corrects the interferometric position measurement based on the monitored refractivity at the first location and a non-trivial function mapping refractivity at first location to that near the movable stage during different stages of a process cycle of the system.

Embodiments of the invention can include one or more of the features described in regard to other aspects of the invention. Alternatively, or additionally, embodiments of the invention can include one or more of the following features.

The system can include a photolithography exposure system, which is housed in the chamber. The photolithography exposure system can include an illumination source. During operation of the system, the movable stage can position a wafer relative to the illumination source. The system can include a wafer feeding system configured to position wafers on the movable stage or remove wafers from the movable stage.

In some embodiments, the system includes a beam writing apparatus, which is housed in the chamber. The beam writing system can include a beam source and during operation of the system the movable stage positions a wafer relative to the beam source.

The system can include a gas inlet configured to introduce gas into the chamber. Alternatively, or additionally, the system can include a gas exhaust configured to exhaust gas out of the chamber.

The interferometry system can include an interferometer (e.g., a heterodyne or homodyne interferometer) configured to accept an input beam from a source and to derive a measurement beam from the input beam. The interferometry system can include a wavelength monitor to monitor the wavelength of the measurement beam. The wavelength monitor can be configured to interferometrically monitor the wavelength of the measurement beam.

In some embodiments, the interferometry system can include an angle displacement interferometer. The interferometry system can also include a dynamic element adapted to adjust the direction of the input beam in response to a signal from the angle displacement interferometer.

The interferometry system can also include a measurement object, and at least one of the interferometer and the measurement object are attached to the movable stage.

The first location may be remote from the measurement path.

Embodiments of the invention may include one or more of the following advantages.

They may accurately compensate for optical path length effects of a gas in a measurement path and/or a reference path of an interferometer. Optical path length effects can include those in which the refractive index and/or the physical length of the measurement and/or reference paths may be changing. An example of this is measuring the optical path length between a fixed interferometer and a measurement object attached to a scanning stage.

They may be used to validate or replace dispersion interferometry systems.

Some embodiments may enable rapid and accurate compensation of the optical path length effects of a gas in a measurement path and/or a reference path wherein the accuracy of compensation of optical path length effects of the gas are substantially not compromised by a rapid change in physical length of measurement and/or reference paths.

In some embodiments, optical path length effects of a gas can be compensated rapidly and accurately without requiring measurement and monitoring of environmental conditions such as temperature and pressure. Alternatively, or additionally, optical path length effects of a gas may be compensated rapidly and accurately without measuring and/or monitoring the composition of the gas. Furthermore, in some embodiments, optical path length effects of a gas may be compensated without measuring thermodynamic properties of the gas such as temperature and pressure along the measurement path.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Interferometry systems can provide highly accurate measurements. Such systems can be especially useful in lithography applications used in fabricating large scale integrated circuits such as computer chips and the like. Lithography is a key technology driver for the semiconductor manufacturing industry. In lithography, overlay improvement is one of the five most difficult challenges down to and below 100 nm line widths (design rules), see, for example, the *Semiconductor Industry Roadmap*, p.82 (1997). For a general reference on lithography, see also, for example, J. R. Sheats and B. W. Smith, in *Microlithography: Science and Technology* (Marcel Dekker, Inc., New York, 1998), the contents of which is incorporated herein by reference.

Overlay depends directly on the performance, i.e., accuracy and precision, of the distance measuring interferometers used to position the wafer and reticle (or mask) stages. Since a lithography tool may produce $50–100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

Figure 1:
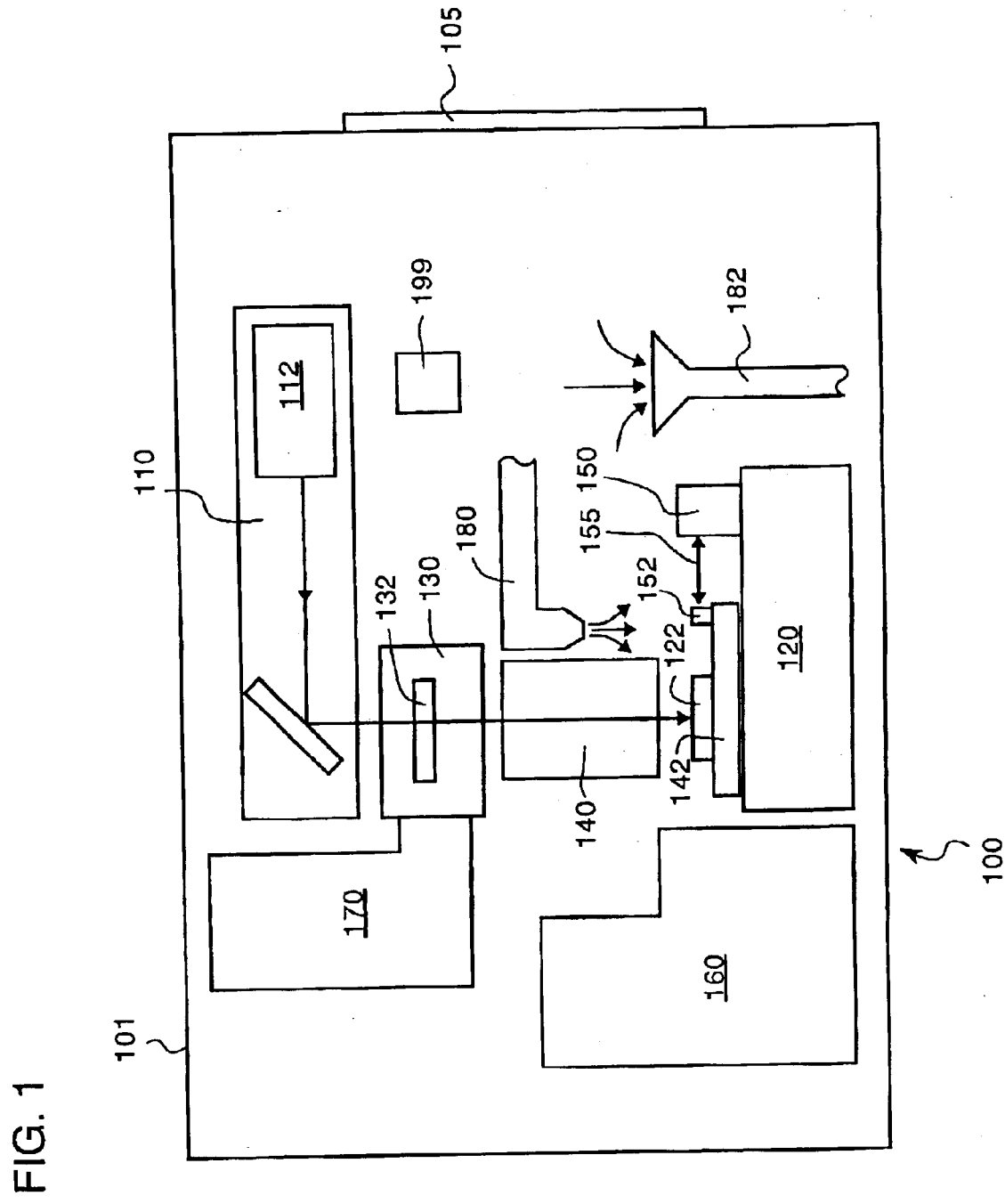
FIG. 1 is a schematic diagram of a lithography system.

Referring to FIG. 1, a lithography system 100, also referred to as an exposure system, typically includes an illumination system 110 and a wafer positioning system 120, and a reticle stage 130. Illumination system 110 includes a radiation source 112 for providing radiation such as ultraviolet, visible, x-ray, electron, or ion radiation. Reticle stage 130 supports a patterned reticle 132, which is also referred to as a mask. These terms are used interchangeably below. Reticle 132 imparts a pattern to radiation from illumination system 110, thereby generating the spatially patterned radiation. For the case of reduction lithography, lithography system 100 also includes a reduction lens 140 for imaging the spatially patterned radiation onto a wafer 122. Wafer positioning system 120 includes a wafer stage 142 that positions and supports wafer 122 during the exposure. Wafer positioning system 120 can also include, e.g., piezoelectric transducer elements and corresponding control electronics. The imaged radiation exposes resist coated onto the wafer. The radiation initiates photo-chemical processes in the resist that convert the radiation pattern into a latent image within the resist.

In embodiments that use proximity printing, as opposed to those implementing reduction lithography, the scattered radiation propagates a small distance (typically on the order of microns) before contacting the wafer to produce a 1:1 image of the reticle pattern.

Lithography system 100 also includes a wafer feeding system 160 and a reticle changer 170. Wafer feeding system 160 is supplied with a batch of wafers and automatically loads wafers on the wafer stage and removes wafers once they have been exposed. Reticle changer 170 selects the appropriate reticle for each exposure and positions the selected reticle on reticle stage 130.

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, the translatable wafer stage supporting the photoresist-coated wafer moves the wafer so that the radiation exposes the correct location of the wafer.

Lithography system 100 is enclosed in a chamber 101, which allow the wafer's environment to be controlled during exposure. An access port 105 provides access to the exposure apparatus, wafer feeding system and reticle chamber. Chamber 101 also includes a gas inlet 180 and a gas exhaust 182 for introducing and removing processes gas(es) into and out of the chamber, respectively. Chamber 101 helps to reduce contaminants (e.g., dust or undesirable gases), which may scatter and/or absorb the exposing radiation and degrade the light pattern at the wafer. The chamber also allows control over the composition of the atmosphere adjacent the wafer. This is especially important when the exposing radiation is strongly absorbed or scattered by air. UV radiation, for example, is strongly absorbed by oxygen, making oxygen-rich atmospheres, such as air, undesirable for UV systems. Typically, an enclosed lithography system will be flushed with nitrogen, or some other gas or gas mixture more suitable for the exposing radiation wavelength.

Lithography system 100 also includes an interferometry system that precisely measures the position of the wafer in the lithography system. The interferometry system includes an interferometer 150 and a measurement object 152. Interferometer 150 is attached to wafer positioning system 120 and measurement object 152 is attached to wafer stage 142. Measurement object 152 includes, e.g., a plane mirror for reflecting a measurement beam 155 directed to the stage by interferometer 150. The measurement beam reflects back to the interferometer 150.

In other embodiments of the lithography system, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithography system can include what is known in the art as a column reference. In such embodiments, the interferometer 150 directs the reference beam (not shown) along an external reference path that contacts a reference mirror (not shown) mounted on some structure that directs the radiation beam, e.g., reduction lens 140. The reference mirror reflects the reference beam back to the interferometry system. The interference signal produced by the interferometry system when combining measurement beam 155 reflected from measurement object 152 and the reference beam reflected from a reference mirror mounted on the reduction lens 140 indicates changes in the position of the stage relative to the radiation beam.

Examples of suitable interferometry systems are described below. Although not included in the described embodiment, one or more interferometry systems can also be used to precisely measure the position of the reticle stage as well as other movable elements whose position must be accurately monitored in processes for fabricating lithographic structures (see supra, Sheats and Smith, *Microlithography: Science and Technology*).

In general, interferometry systems can be used to precisely measure the positions of each of the wafer stage and reticle stage relative to other components of the exposure system, such as the lens assembly, radiation source, or support structure. In such cases, as in the described embodiment, the interferometer is attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

In the described embodiment, the interferometry system also includes a refractometer 199, positioned in the chamber at a location remote from the measurement beam path. During operation, refractometer 199 monitors the refractivity of the chamber gas at that location. An example of a suitable refractometer is described in detail below. During operation, a processor (not shown) compensates the interferometry measurement based on the remote refractometer measurement. To do this, the processor uses a non-trivial function to map the measured refractivity at the remote location to the refractivity of the gas in the path of measurement beam 155.

The non-trivial function is more complex than a one-to-one mapping. Although the chamber allows a degree of environmental control for the lithography system, there can be significant density variations, gas movement, and/or gas turbulence within the chamber. One source of disruption to the equilibrium of the gas in the chamber can be the measurement object's motion as the wafer or reticle is scanned relative to the exposing illumination. Other examples include, introducing process gas to the chamber via gas inlet 180, and exhausting gas via gas exhaust 182. Both of these functions can give rise to turbulence and density and composition variations within the chamber. Loading and unloading of wafers can also lead to gas movement in the chamber. Furthermore, when introducing and removing wafers to and from the chamber via the access port, gas can leak into and/or out of the chamber, further disturbing the chamber atmosphere's equilibrium. Moreover, leaks from air locks and/or corrupt seals, for example, may cause composition variations in the chambers atmosphere. For example, a leak from an air bearing, which may be used to provide vibration dampening for a wafer stage, can introduce air (or other gas) into the system during exposure.

The non-trivial function can be parameterized according to different steps in the lithography exposure cycle. Because a similar sequence of events occurs during the exposure of each wafer, many changes in a lithography system's atmosphere are periodic. For example, after positioning a wafer relative to the reduction lens, the system may flush the wafer with nitrogen gas prior to exposing the wafer. Alternatively, or additionally, the wafer stage may scan the position of the wafer in a similar fashion each exposure. Due to the cyclic nature of the process, if each process step's effect on the chamber atmosphere is known for a single exposure cycle, the effect of the corresponding step in subsequent cycles can be inferred. Thus, in preferred embodiments, the non-trivial function relates the measured gas refractivity to the refractivity in the path of beam 155 according to the particular stage of the lithography exposure cycle at which the measurement was made.

In some embodiments, the non-trivial function allows the system to compensate interferometic measurements for effects of stationary non-random changes and/or certain effects of stationary random fluctuations in the refractivity of gas in the measurement and/or reference beam paths. Non-random changes (i.e., systematic changes) and the random fluctuations in refractivity include effects of changes and fluctuations in gas density and composition. As used herein, the property of stationarity means that the probability-space parameters of a process classified as stationary are invariant under a translation in time modulo a time interval. In other words, the mean and variance of the relevant probability-space parameters are related at equivalent stages of each exposure cycle of a lithography tool. The aforementioned time interval for a given lithography tool is the reciprocal of the rate at which wafers are processed by the tool.

In general, the non-trivial function can be in any format suitable for mapping one value to another value based on one or more parameters. For example, the non-trivial function can be an analytic function, a set of analytic functions, an algorithm or a lookup table. One example is a set of analytic functions, each function corresponding to a different system parameter (e.g., the stage of the exposure cycle).

The non-trivial function can be determined empirically, computationally, or using a combination of empirical and computational techniques.

One example of a method for determining the function empirically is to execute one or more lithography exposure cycles with additional sensors in the chamber, and to monitor one or more parameters at the sensor locations during the cycle. A simple example of this is to place an additional refractometer in the measurement beam path and to monitor the refractivity there as well as at the remote position during a test exposure. During subsequent operation of the system, the processor would use the non-trivial function to determine the gas refractivity in the measurement beam path from the value measured at the remote location according to the values measured during the test exposure. This example, however, does not necessarily account for random fluctuations in the gas refractivity that may occur during exposure. Nor does it account for how the presence of the second refractometer in the measurement beam path might affect gas refractivity there.

Another example is to monitor the refractivity and other parameters related to the gas (e.g., pressure, velocity, temperature, humidity) at multiple locations in the chamber during multiple test exposure cycles. The information acquired during these test cycles can be stored in a lookup table or used to determine an analytic function or functions, from which the measured refractivity at the remote location can be related to the refractivity in the measurement beam path.

An example of a computational method if to determine the non-trivial function using commercial computational fluid dynamics programs. One example of such a program is Star CD, available from the CD adapco Group (Melville, N.Y.). In general, computational fluid dynamics solve fluid dynamics problems in complex systems by solving one or more sets of differential equations relating parameters of the fluid (e.g., density, temperature) at a set of discrete locations and times within the system. For example, for an incompressible fluid, one might use the Navier-Stokes equation, which is the fundamental partial differential equation that describes the flow of such fluids. The set of discrete locations, often referred to as a mesh, is usually defined according to the physical structure of the system. The differential equation(s) usually requires a set of user-defined boundary values describing, e.g., initial system conditions to be entered prior to solving. These can include boundary conditions for any parameter, such as an initial temperature profile, or the temperature of certain portions of the mesh at particular times during a cycle.

Accordingly, by determining an appropriate mesh and entering conditions for the exposure cycle, one can computationally determine values of the gas refractivity and/or other parameters at different locations in the chamber during the cycle. These values provide the non-trivial function, which relates gas refractivity measured at the remote location to the refractivity in the path of the interferometer measurement beam.

Embodiments of interferometry systems are shown and described below. While they differ in some details, the disclosed embodiments otherwise share many common elements. As will be seen, the disclosed embodiments differ in the details of how their interferometric optical paths are implemented and/or how certain information signals are handled electronically.

Figure 2:
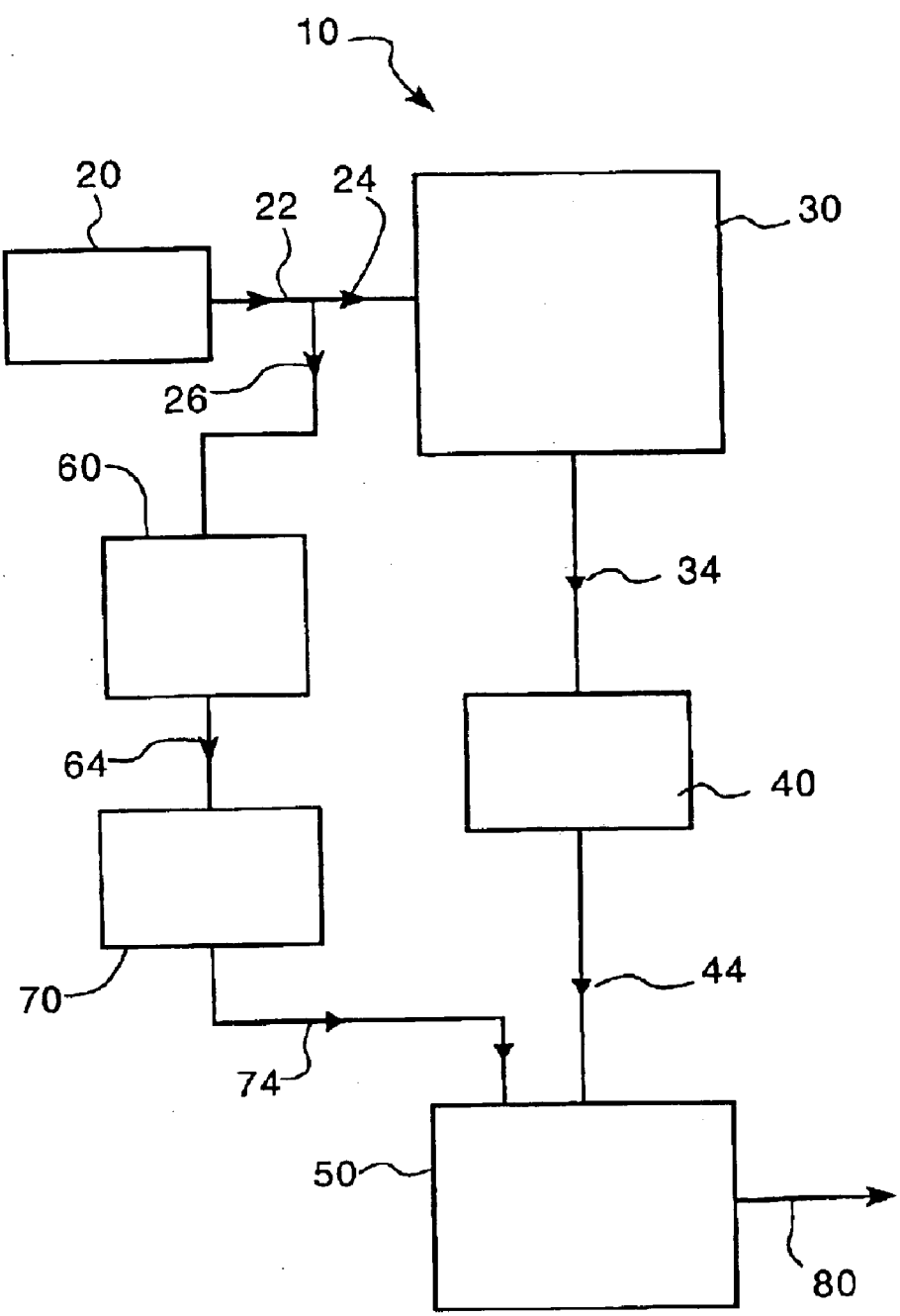
FIG. 2 is a schematic diagram of an interferometry system.

Referring to FIG. 2, an interferometry system generally shown at numeral 10 includes a source 20, an interferometer 30, a detector 40, an electronic processor 50, and monitor 60. Source 20 includes a laser or some other source of a coherent beam for providing beam 22 including one or more components wherein a first portion of beam 22 is transmitted to interferometer 30 as beam 24 and a second portion of beam 22 reflected to monitor 60 as beam 26. For single wavelength interferometry, monitor 60 comprises a refractometer and may comprise a wavelength monitor. For interferometry requiring two or more wavelengths, beam 22 includes at least two beams at different wavelengths, e.g., 1064 nm and 532 nm and monitor 60 may comprise a refractometer, a $\Gamma$ monitor where $\Gamma$ is the reciprocal dispersive power of a gas, and wavelength monitors. For optical path displacement measurements, a single wavelength may be sufficient. When using heterodyne interferometry techniques at one or more different wavelengths, source 20 introduces a frequency splitting between components of each beam at the one or more different wavelengths. For example, one or more acousto-optical modulators can be used to introduce the frequency splitting, or alternatively, the source can include a Zeeman-split laser to produce the frequency splitting. Often the frequency-split components are made to have orthogonal polarizations. The frequency-split components of beams 22 can be sent to interferometer 30 where they are separated in interferometer 30 into measurement and reference beams.

Interferometer 30 can be any type of interferometer, e.g., a differential plane mirror interferometer, a double-pass interferometer, a Michelson-type interferometer and/or a similar device such as is described in an article entitled "Differential interferometer arrangements for distance and angle measurements: Principles, advantages and applications" by C. Zanoni, *VDI Berichte* Nr. 749, 93–106 (1989). Interferometer 30 may also comprise a passive zero shear plane mirror interferometer as described in the commonly owned U.S. patent application Ser. No. 10/207,314 filed Jul. 29, 2002 and entitled "PASSIVE ZERO SHEAR INTERFEROMETERS" or an interferometer with a dynamic beam steering element such as described in commonly owned U.S. patent application Ser. No. 09/852,369 filed May 10, 2001 and entitled "APPARATUS AND METHOD FOR INTERFEROMETRIC MEASUREMENTS OF ANGULAR ORIENTATION AND DISTANCE TO A PLANE MIRROR OBJECT" and commonly owned U.S. Pat. No. 6,271,923 issued Aug. 7, 2001 entitled "INTERFEROMETRY SYSTEM HAVING A DYNAMIC BEAM STEERING ASSEMBLY FOR MEASURING ANGLE AND DISTANCE," all of which are by Henry Allen Hill. The contents of the article by Zanoni and the three cited patents by Hill are included herein in their entirety by way of reference. The interferometer can be designed to monitor, for example, changes in optical path length, changes in physical path length, changes in refractive index, changes in wavelength of a beam, changes in direction of propagation of a beam, or changes in intrinsic gas properties along a measurement path.

Interferometer 30 may also comprise interferometers configured to measure and/or monitor the shape of stage mirrors in-situ such as described in commonly owned U.S. Provisional Application with Ser. No. 09/853,114 entitled "In-Situ Stage Mirror Characterization," the contents of which is incorporated herein by reference.

Interferometer 30 directs a reference beam along a reference path (which contacts a reference object) and a measurement beam along a measurement path contacting a measurement object (e.g., a lithography stage), and then combines the reference and measurement beams to form an overlapping pair of exit beams 34. In dispersion interferometry applications, there are overlapping pairs of exit beams for each of the different wavelengths.

The interference between the overlapping pair of exit beams contains information about the relative difference in optical path length between the reference and measurement paths. In some embodiments, the reference path is fixed and therefore changes in the optical path length difference correspond to changes in the optical path length of the measurement path. In other embodiments, however, the optical path length of both the reference and measurement paths can be changing. For example, the reference path can contact a reference object (e.g., a column reference) that may move relative to the interferometer. In this latter case, the changes in the optical path length difference correspond to changes in the position of the measurement object relative to changes in position of the reference object.

When the reference and measurement beams have orthogonal polarizations, the intensity of at least one intermediate polarization of the overlapping pair of exit beams is selected to produce optical interference. For example, a polarizer can be positioned within detector 40. Detector 40 measures the intensity of the selected polarization of the overlapping pair of exit beams to produce an interference signal. Portions of the beams can be combined with one another before being directed along the reference and measurement paths to provide a reference pair of overlapping exit beams, which is used to provide a reference interference signal. Furthermore, in some embodiments, a polarizer is included in interferometer 30, and exit beams 34 emerge as a mixed beam having the selected polarization.

Detector 40 includes a photodetector that measures preferably by a quantum photon detector the intensity of the overlapping pair of exit beams having the selected polarization, and electronics such as a preamplifier and an analog-to-digital converter, which amplify the output from the photodetector and produce an electrical interference signal 44. Interference signal 44, preferably a digital signal corresponds to the optical interference. In dispersion interferometry applications, electrical interference signals are produced for each of the overlapping pair of exit beams (which correspond to different wavelengths) by using multiple photodetection channels within detector 40. Interference signal 44 is transmitted to electronic processor 50. Interferometer 30 and detector 40 may also include an optical fiber (not shown) to couple beam 34 to the photodetector.

The index of refraction the gas in the system comprising interferometer system 10 and in particular in monitor 60 is measured and monitored by a refractivity monitor or a refractometer. Monitor 60 may comprise a interferometric apparatus such as described in commonly owned U.S. Pat. No. 4,685,803 entitled "METHOD AND APPARATUS FOR THE MEASUREMENT OF THE REFRACTIVE INDEX OF A GAS" or U.S. Pat. No. 4,733,967 entitled "APPARATUS OF THE MEASUREMENT OF THE REFRACTIVE INDEX OF A GAS" both by Gary E. Sommargren, the contents of both cited patents included herein in their entirety by way of reference. A portion of input beam 26 is transmitted by monitor 60 to detector 70 as output beam 64. The description of detector 70 is the same as the corresponding portion of the description given for detector 40. Beam 64 is detected by detector 70 as electrical interference signal 74. Interference signal 74 is transmitted to analyzer 50 preferably in a digital format.

Monitor 60 may include a wavelength monitor and a $\Gamma$ monitor such as described in commonly owned U.S. Pat. No. 6,124,931 entitled "APPARATUS AND METHODS FOR MEASURING INTRINSIC OPTICAL PROPERTIES OF A GAS" by Henry Allen Hill, the contents of which are herewithin incorporated in their entirety by way of reference.

Effects of changes and fluctuations in refractivity of the gas in the measurement path are compensated in electronic processor 50 by using measured values of refractivity of the gas at one location different from the measurement paths of the interferometer 30 and the known non-trivial relationship.

The measured values of refractivity of the gas are obtained by electronic processor 50 by processing information contained in interference signal 74. Phase information compensated for stationary non-random effects and certain effects of stationary random fluctuations in refractivity of the gas including effects of changes in gas density and composition is generated as output signal 80.

In some embodiments, monitor 60 includes a wavelength monitor. The wavelength monitor may be particularly useful in applications wherein stability of the wavelengths of beam 22 is not sufficient to meet requirements of an end use application. In embodiments including a wavelength monitor, signal 74 includes an electrical interference signal corresponding to an optical interference signal of the wavelength monitor. Electronic processor 50 compensates for effects of changes of wavelengths of beam 22 in the generation of the output signal 80.

In some embodiments, monitor 60 includes a $\Gamma$ monitor. For applications wherein beam 22 includes two or more wavelengths, a $\Gamma$ monitor can be particularly beneficial. In embodiments including a $\Gamma$ monitor, signal 74 comprises electrical interference signals corresponding to an optical interference signals of the $\Gamma$ monitor. Electronic processor 50 compensates for effects of changes and fluctuations in the refractivity of the gas due to changes in composition at the two or more wavelengths of beam 22 using the information in the optical interference signals of the $\Gamma$ monitor in the generation of output signal 80.

Figure 3:
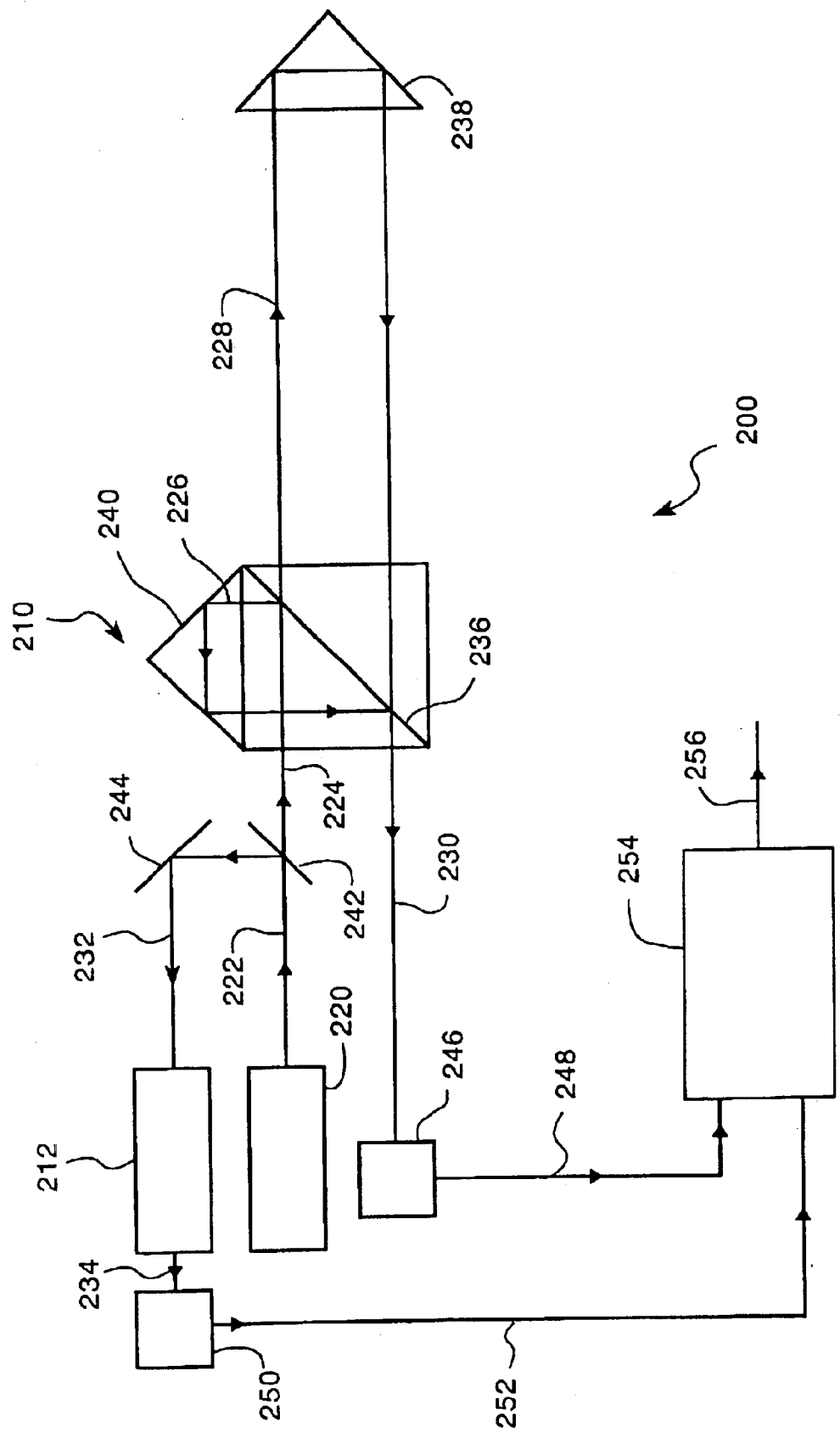
FIG. 3 is a schematic diagram of an interferometry system including a refractometer.

Referring to FIG. 3, an interferometry system 200 includes an interferometer generally depicted at numeral 210. Interferometer 210 is a polarizing, heterodyne, single pass interferometer. This configuration is known in the art as a polarized Michelson interferometer, and is shown as a simple illustration. Although the first embodiment comprises a heterodyne system, the interferometry system is readily adapted for use in a homodyne system in which the reference and measurement beams have the same frequencies before introduction of any Doppler shifts. While the apparatus has application for a wide range of radiation sources, the following description is taken by way of example with respect to an optical measuring system.

A first portion of light beam 222 emitted from source 220 is transmitted by non-polarization beam-splitter 242 to form beam 224. A second portion of beam 222 is reflected by non-polarization beam-splitter 242 to form beam 232 after reflection by mirror 244. The description of source 220 is the same as the description given for source 20.

As shown in FIG. 3, interferometer 210 comprises an object retroreflector 238, a reference retroreflector 240, and a polarization beam-splitter with a polarization beam-splitter interface 236. The measurement beam component of beam 224 is transmitted by polarization beam-splitting interface 236 as beam 228. Beam 228 is reflected by object retroreflector 238 and then transmitted by polarization beam-splitting interface 236 as a measurement beam component of output beam 230. The reference beam component of beam 224 is reflected by polarization beam-splitting interface 236 as beam 226. Beam 226 is reflected by reference retroreflector 240 and then reflected by polarization beam-splitting interface 236 as a reference beam component of output beam 230. During operation of the interferometry system, either or both the refractive index of the gas and the physical length of the measurement path may be changing. The reference and measurement beam components of output beam 230 contain information at wavelength $\lambda_1$ about the optical path length through the reference and measurement paths, respectively. Beam 230 exits interferometer 210 and enters detector 246 to produce electrical interference signal 248. Detector 246 comprises an analyzer to select common polarization states of the components of beam 230.

Interferometer 210 introduces phase shift $\phi_1$ between the measurement and reference beam components of beam 230 so that beam 230 is a phase-shifted beam. The magnitude of phase shift $\phi_1$ is related to round-trip physical lengths $2L_{M1}$ and $2L_{R1}$ of the measurement path and reference paths, respectively, and the index of refraction according to the formula $$\varphi_1 = 2k_1(L_{M1}n_{M1} - L_{R1}n_{R1}) \tag{1}$$

where $n_{M1}$ and $n_{R1}$ are the averages of the refractive index of a gas in the measurement and reference paths, respectively, corresponding to the optical paths introducing phase shift $\phi_1$ and to wavenumber $k_1=2\pi/\lambda_1$. The interferometer shown in FIG. 3 is for a single pass interferometer system to illustrate in the simplest manner the function of the interferometry system. To those skilled in the art, the generalization to the case of a multiple pass interferometer system should be a straightforward procedure. The values for $L_{M1}$ and $L_{R1}$ correspond to the physical lengths of measurement and reference paths, respectively.

Beam 232 is incident on a monitor 212. Beam 234 exits monitor 212 and enters detector 250 to produce electrical interference signal 252 related to the refractivity at the location of monitor 212. Detector 250 includes an analyzer to select common polarization states of the components of beam 234. Electrical interference signal 252 is transmitted to electronic processor 254, where it is used to compensate the interferometric distance measurement.

Figure 4:
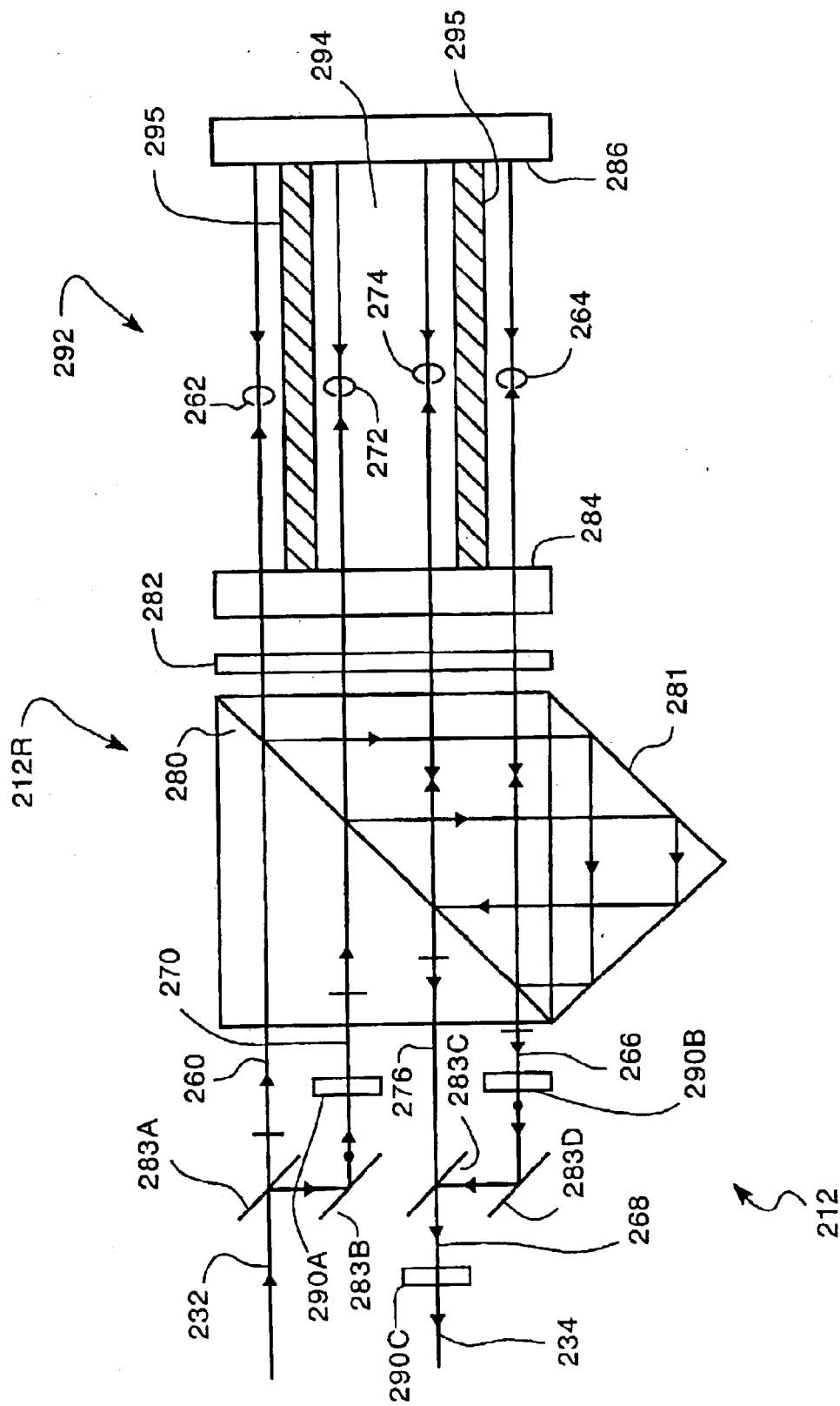
FIG. 4 is a schematic diagram of a refractometer.

Referring to FIG. 4, in some embodiments, monitor 212 includes refractometer 212R. Refractometer 212R includes a differential plane mirror interferometer (DPMI) and a cell generally shown at numeral 292. A measurement beam component of beam 232 is transmitted by a polarization beam-splitter 283A as measurement beam 260 and a reference beam component of beam 232 is reflected by polarization beam-splitter 283A as beam 270 after subsequent reflection by mirror 283B and transmission by half-wave phase retardation plate 290A. Phase retardation plate 290A is oriented to rotate the plane of polarization of beam 270 to be parallel to the plane of FIG. 4.

As illustrated in FIG. 4, beam 260 is incident on refractometer 212R and exits refractometer 212R containing phase information about the measurement path through cell 292. Beam 270 is incident on refractometer 212R and exits refractometer 212R containing phase information about the reference path through cell 292. Interface 280 is a polarizing interface, element 282 is a quarter-wave phase retardation plate, and element 281 is a retroreflector.

Cell 292 comprises window 284, mirror 286, and cylinder 295 to form a chamber 294 that is evacuated. The measurement beams in cell 292 are beams 262 and 264 and the reference beams in cell 292 are beams 272 and 274. Paths of measurement beams 262 and 264 comprise the gas and paths of reference beams 272 and 274 comprise a vacuum.

Measurement beam 266 is first transmitted by half-wave phase retardation plate 290B and then reflected by mirror 283D and polarization beam-splitter 283C as a measurement beam component of beam 268. Phase retardation plate 290B is oriented to rotate the plane of polarization of beam 266 upon transmission by phase retardation plate 290B to be orthogonal to the plane of FIG. 4. Reference beam 276 is first transmitted by polarization beam-splitter 283C as a reference beam component of beam 268. Beam 268 is transmitted by polarizer 290C as output beam 234. Output beam 234 is a mixed beam wherein polarizer 290C is oriented to mix the measurement and reference beam components of beam 268.

Beam 234 contains phase information that can be used to obtain measured values of the refractivity of the gas in refractometer 212R. Refractometer 212R introduces phase shift $\phi_2$ between the measurement and reference beam components of beam 234 so that beam 234 is a phase-shifted beam. The magnitude of phase shift $\phi_2$ is related to physical length $L_2$ of the measurement and reference paths and refractivity of the gas according to the formula $$\phi_2 = 2L_2k_1(n_2-1) \tag{2}$$

where $(n_2-1)$ is the average refractivity of the gas in the measurement paths corresponding to beams 262 and 264.

The specific refractivity of a sample of gas is defined as the ratio of the refractivity and density $\rho$ of the gas sample, i.e. $(n-1)/\rho$. The specific refractivity of a gas such as air is an intrinsic property of the gas and is independent of the density of the gas to a high accuracy [see K. E. Erickson "Long-Path Interferometry through an Uncontrolled Atmosphere," *JOSA* 52, 781–787 (1962)]. Thus, the refractivity $[n(x,y,z,t)-1]$ at spatial and temporal coordinates (x,y,z,t) is related to a high accuracy to $[n(x_0,y_0,z_0,t)-1]$ at spatial and temporal coordinates $(x_0, y_0, z_0, t)$ according to the formula $$[n(x, y, z, t) - 1] = [n(x_0, y_0, z_0, t) - 1]\left(\frac{\rho(x, y, z, t)}{\rho(x_0, y_0, z_0, t)}\right). \tag{3}$$

It also follows to first order that for two gas samples of extended volumes, the average values of $[n(x,y,z,t)-1]$ and $[n(x_0,y_0,z_0,t)-1]$ for the respective gas samples are related by the relationship $$(n_1 - 1) = (n_2 - 1)\left(\frac{\rho_1}{\rho_2}\right) \tag{4}$$

where $(n_1-1)$ and $\rho_1$ are corresponding average values and $(n_2-1)$ and $\rho_2$ are corresponding average values. In the case where the composition of the gas is a function of (x,y,z,t), and additional factor is introduced into Eq. (4).

Referring again to FIG. 3, the known non-trivial relationship between properties of the density of the gas $\rho(x,y,z,t)$ and $\rho(x_0,y_0,z_0,t)$ is established by an independent apparatus and method. Stationary properties of densities $\rho(x,y,z,t)$ will depend on the conditions of the environment of interferometer 210 and monitor 212. For an interferometer and monitor located in a lithography tool, the conditions comprise such parameters as the location and orientation of a wafer stage and the state of linear and angular motion of the wafer stage.

One apparatus that may be used to establish the known non-trivial relationship between properties of $\rho(x,y,z,t)$ and $\rho(x_0,y_0,z_0,t)$ is based on dispersion interferometry (see cited references to dispersion interferometry). Other techniques may be employed to establish the relationship such as temperature sensing elements located in the environment of the interferometer and refractometer. Another apparatus that may be used to establish the relationship is an acoustic interferometric measurement of the speed of sound and a measurement of the velocity fields of the gas over corresponding measurement paths. Keeping first order terms in a power series representation, the relationship may be written to a good approximation as $$\rho(x, y, z, t) = \rho(x_0, y_0, z_0, t) \left[ \begin{array}{c} 1 - \left(\frac{1}{\gamma - 1}\right)\left(\frac{\Delta T}{T(x_0, y_0, z_0, t)}\right) - \\ \left(\frac{1}{2}\right)\left[\frac{\rho(x_0, y_0, z_0, t)(v^2 - v_0^2)}{P(x_0, y_0, z_0, t)}\right] \end{array} \right] \quad (5)$$

where $$\Delta T = T(x,y,z,t) - T(x_0, y_0, z_0, t) \quad (6)$$

P(x,y,z,t) and v are the pressure of the gas and the speed of the velocity field, respectively, at spatial and temporal coordinates (x,y,z,t), $v_0$ is the speed of the velocity field at spatial and temporal coordinates $(x_0, y_0, z_0, t)$, and γ is the ratio of specific heats of the gas at constant pressure and constant volume. The quantities ΔT and $v^2$ are examples of effects of stationary non-random changes and of certain effects of random fluctuations in the gas. Certain effects of stationary random fluctuations in the gas include, for example, the mean of the fluctuations in the temperature and the mean of the square of the random fluctuations in v.

The speed of sound in a gas such as air is proportional to the $T^{1/2}$ so that ΔT may be obtained directly from the measured phase of the ultrasound interferometric signal. The value for $v^2$ can be determined by a computational fluid dynamic code (CFD).

The phase of an acoustic interference signal can be more sensitive to changes in gas density associated with changes in gas temperature than the phase of a dispersion optical signal. Accordingly, the accuracy required of acoustic phase measurement relative to the accuracy required for the optical dispersive phase measurement is expressed by the factor $$\left[\frac{(\gamma - 1)}{2}\right]\left[\frac{\Gamma}{(n-1)}\right]\frac{\lambda}{\Lambda} \quad (7)$$

where Λ is the wavelength of the ultrasonic acoustic beam. For a frequency of 300 kHz for the acoustic beam, Λ=1 mm. The factor given by Eq. (7) is 10 for dry air at STP and λ=0.633μ and 0.316μ for which inverse dispersive power Γ=22.6. At a frequency of 300 kHz, the amplitude attenuation of the ultrasound beam is 15 db/m.

The magnitude of the quantity $[\rho(x,y,z,t)v^2]/2P(x,y,z,t)$ is $$\left(\frac{1}{2}\right)\left(\frac{\rho(x, y, z, t)v^2}{P(x, y, z, t)}\right) = 0.6 \times 10^{-5} v^2 \quad (8)$$

for air at STP and with v having the units of m/s. Electronic processor 254 compensates the measured phase $\phi_1$ for the effects of $n_1$ using the non-trivial function. Compensated phase information corresponding to changes in $(L_{M1} - L_{R1})$ is transmitted as signal 256.

The accuracy to which the phase redundancies phase offsets of $\phi_2$ need be resolved and the accuracy to which phase offset of $\phi_2$, lengths $L_{R1}$ and $L_2$, and ratios $\rho_{M1}/\rho_2$ and $\rho_{R1}/\rho_2$ need be known can depend, for example, upon the measurement accuracy required for displacement measurements in an end use application, the range of variation in $\phi_2$, and the range of variation in $\rho_1/\rho_2$. A sensitivity analysis can be performed to determine the sensitivity of $[(L_{M1}-L_{R1})_2 - (L_{M1}-L_{R1})_1]$ to various quantities wherein the various quantities comprise phase redundancy and phase offset error in $\phi_2$, errors in measured values of lengths $L_{R1}$ and $L_2$, and errors in computed ratio values of $\rho_{M1}/\rho_2$ and $\rho_{R1}/\rho_2$.

The properties of density profile ratio $\rho(x,y,z,t)/\rho(x_0,y_0,z_0,t)$ will, in general, depend on conditions of a lithography tool, e.g., the scan speeds of a wafer stage or reticle stage. For lithography systems configured with apparatus for making interferometric distance and angle measurements to and of two different object mirrors wherein the two object mirrors are nominally orthogonal to each other in the plane of the corresponding distance measurements, the stationary properties of density profile ratio $\rho(x,y,z,t)/\rho(x_0,y_0,z_0,t)$ can be tested for self-consistency. The shape of the two object mirrors will be substantially independent of scan speeds in the directions of the distance measurements so that the compensated distance and angle measurements should be substantially independent of the scan speeds in the two orthogonal directions. Thus, the properties of density profile ratio $\rho(x,y,z,t)/\rho(x_0, y_0,z_0,t)$ can be tested for self-consistency with respect to changes in the scan speeds in the two orthogonal directions.

Another condition that will affect the properties of density profile ratio $\rho(x,y,z,t)/\rho(x_0,y_0,z_0,t)$ is the rate of exchange of gas in the lithography tool. The shape of the two object mirrors will be substantially independent of the rate of exchange of gas in the lithography tool so that the compensated distance and angle measurements should be substantially independent of the gas exchange rate. Thus, the stationary properties of density profile ratio $\rho(x,y,z,t)/\rho(x_0, y_0,z_0,t)$ can be tested for self-consistency with respect to changes in gas exchange rate.

Other tests of self-consistency can be generated by changing other parameters that do not substantially affect the shape of the two object mirrors. One such parameter is the composition of the gas that affects for example the heat capacity of the gas as well as the refractivity.

Another procedure for testing the properties of density profile ratio $\rho(x,y,z,t)/\rho(x_0,y_0,z_0,t)$ for accuracy is by interferometric measurements made with additional interferometers. Measurement paths of the additional interferometers may comprise fixed or variable physical lengths that intersect or pass near the measurement path of interferometer 210 and measuring the corresponding changes in optical path length(s) and the refractivity measured by monitor 212. The additional interferometers may also comprise angle measuring interferometers and measuring corresponding changes in directions of propagation of the measurement beams of the additional interferometers such as subsequently described with respect to the third embodiment of the present invention and the refractivity measured by monitor 212.

Figure 5:
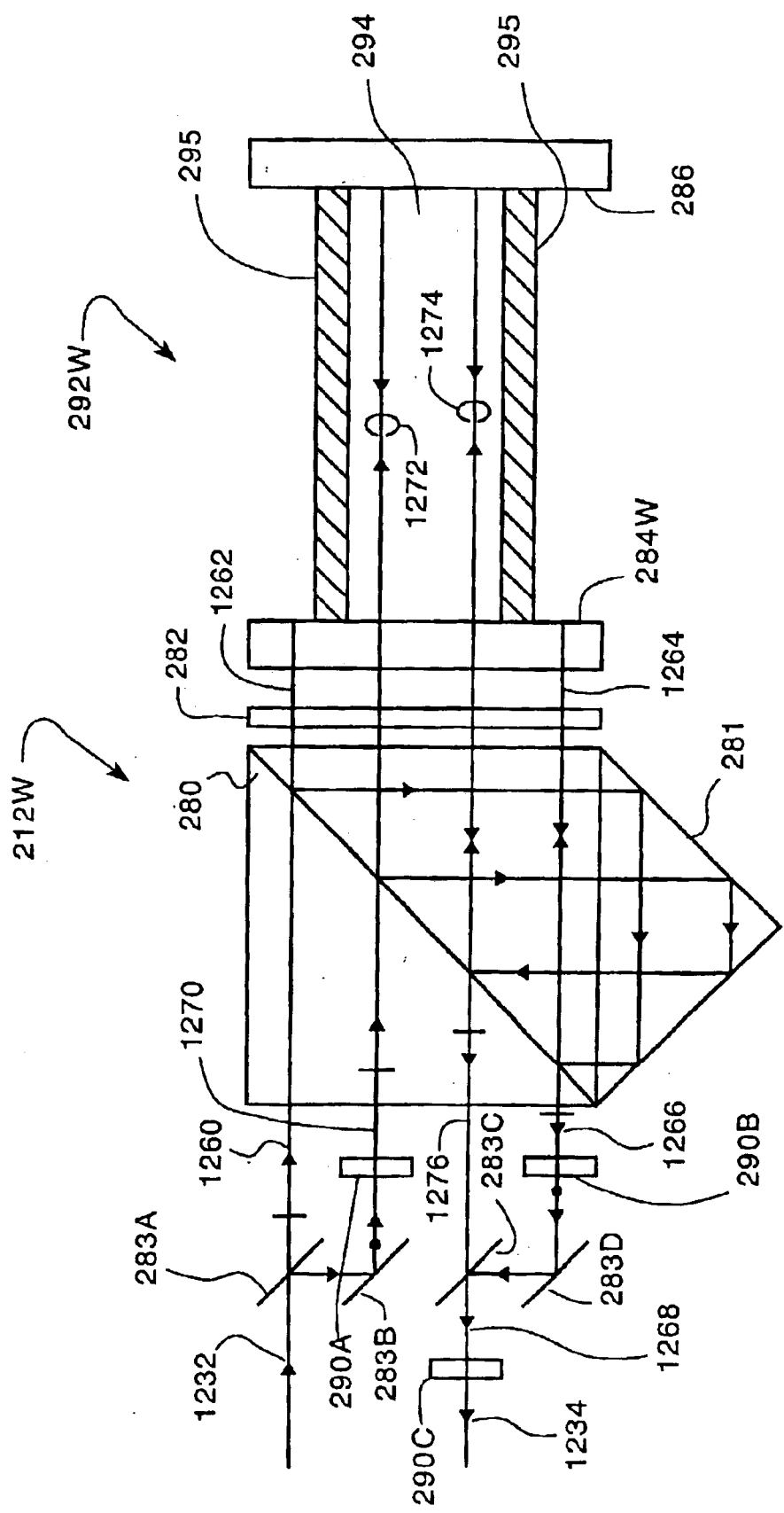
FIG. 5 is a schematic diagram of a wavelength monitor.

Other embodiments of interferometry systems can include a wavelength monitor. Such systems can compensate interferometry measurements for changes in $\lambda_1$, in addition to changes in the gas refractivity. Referring to FIG. 5, a wavelength monitor 212W includes a DPMI and a vacuum cell generally shown at 292W. Many elements of wavelength monitor 212W perform like functions and like numbered elements of refractometer 212R shown in FIG. 4. As described above with reference to FIG. 4, a first portion of beam 232 is split off by a non-polarization beam splitter (not shown) to form an input beam for refractometer 212R. The remaining portion of beam 232 is used as an input beam 1232 for wavelength monitor 212W.

Referring to FIG. 5, a measurement beam component of beam 1232 is transmitted by a polarization beam-splitter 283A as measurement beam 1260 and a reference beam component of beam 1232 is reflected by polarization beam-splitter 283A as beam 1270 after subsequent reflection by mirror 283B and transmission by half-wave phase retardation plate 290A. Phase retardation plate 290A is oriented to rotate the plane of polarization of beam 1270 to be parallel to the plane of FIG. 5.

Beam 1260 is incident on refractometer 212W and exits refractometer 212W containing phase information about the measurement path through cell 292W. Beam 1270 is incident on wavelength monitor 212W and exits containing phase information about the reference path through cell 292W. Interface 280 is a polarizing interface, element 282 is a quarter-wave phase retardation plate, and element 281 is a retroreflector.

Element 284W in vacuum cell 292W has a transmitting surface section for reference beams 1272 and 1274 and a reflecting surface section for measurement beams wherein the transmitting and reflecting surface sections of element 284W belong to the same plane surface of element 284W. Beams 1262 and 1264 are reflected by the reflecting surface section of element 284W.

Measurement beam 1266 is first transmitted by half-wave phase retardation plate 290B and then reflected by mirror 283D and polarization beam-splitter 283C as a measurement beam component of beam 1268. Phase retardation plate 290B is oriented to rotate the plane of polarization of beam 1266 upon transmission by phase retardation plate 290B to be orthogonal to the plane of FIG. 5. Reference beam 1276 is transmitted by polarization beam-splitter 283C as a reference beam component of beam 1268. Beam 1268 is transmitted by polarizer 290C as output beam 1234. Output beam 1234 is a mixed beam wherein polarizer 290C is oriented to mix the measurement and reference beam components of beam 1268.

Wavelength monitor 212W introduces phase shift $\phi_3$ between the measurement and reference beam components of beam 1234 so that beam 1234 is a phase-shifted beam. The magnitude of phase shift $\phi_3$ is related to round-trip physical length $2L_3$ of the measurement and reference paths and wavenumber $k_1$ according to the formula $$\phi_3 = 2L_3 k_1. \tag{9}$$

The value for $L_3$ corresponds to twice the physical length difference of the reference beam and measurement beam paths.

An electronic processor (not shown) performs the same functions as electronic processor 254 (see FIG. 3) and further compensates phase $\phi_1$ for changes in wavelength $\lambda_1$ using measured values for $\phi_2$, $\phi_3$, $L_2$, and $L_3$ and the following formulae based on Eq. (1);

$$(L_{M1} - L_{R1}) = \frac{\varphi_1}{k_1} \frac{1}{n_{M1}} - L_{R1} \frac{(n_{M1} - n_{R1})}{n_{M1}}, \tag{10}$$

or $$(L_{M1} - L_{R1}) = 2L_3 \frac{\varphi_1}{\varphi_3} \frac{1}{\left[1 + \left(\frac{\varphi_2}{2k_1 L_2}\right)\left(\frac{\rho_1}{\rho_2}\right)\right]} - L_{R1} \frac{(n_{M1} - n_{R1})}{n_{M1}}. \tag{11}$$

The accuracy to which the phase redundancy of $\phi_1$ and $\phi_3$ need be resolved can depend, for example, upon the measurement accuracy required for an end use application, the range of variations in $\phi_2$ and $\phi_3$, and the range of variation in $\rho_1/\rho_2$. The description of a sensitivity analysis with respect to systematic errors in certain of the quantities is the same of the description given for the analysis with respect to systematic errors of the first embodiment of the present invention.

In some embodiments, the interferometry system can be adapted to measure and monitor changes in the optical path length of a measurement path and the direction of propagation of the measurement beam. Both the optical path length measurements and the beam direction measurements can be compensated for effects fluctuations of gas refractivity. In such embodiments, the refractive index of the gas, the physical length of the measurement path, and/or the orientation of a measurement object may be changing during the measuring.

Figure 6:
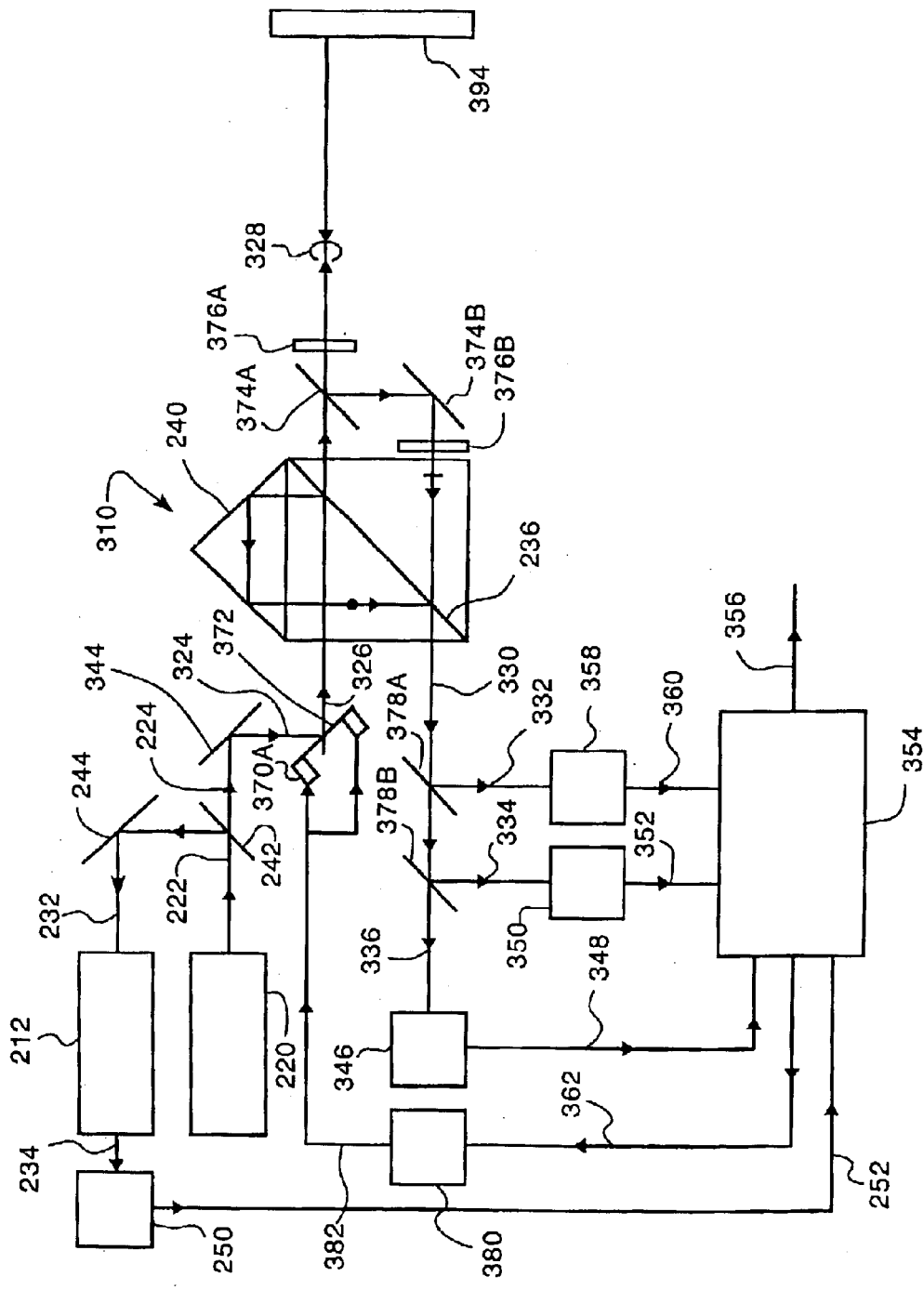
FIG. 6 is a schematic diagram of an interferometry system including an angle displacement interferometer.

Referring to FIG. 6, an interferometry system includes a polarizing, heterodyne, single pass interferometer with a dynamic beam-steering element 372, refractometer 212, and angle displacement interferometers 350 and 358. Although the present embodiment includes a heterodyne system, homodyne systems, in which the reference and measurement beams have the same frequencies before introduction of any Doppler shifts, can also be used.

Many elements of the embodiment shown in FIG. 6 perform like functions as like numbered elements of previously described embodiments. The present embodiment measures a displacement of mirror 394 at one spot on the reflecting surface of mirror 394 and measures the change in orientation of mirror 394 in a plane by measuring a corresponding change in a direction of propagation of a beam that is orthogonal to the surface of mirror 394 independent of changes in orientation of mirror 394. In addition, there can be substantially no shears of reference and measurement beams in single pass interferometer 310 and angle displacement interferometers 358 and 350 and the shear of the measurement beam of the single pass interferometer 310 at mirror 394 is one half of the shear of an output beam of a double pass plane mirror interferometer measuring displacements of the same measurement object, i.e. mirror 394. The displacements measured by the single pass interferometer and the angle displacement interferometers are used to monitor linear displacements of mirror 394 and a change in angular orientation of mirror 394 in a plane both of which are compensated for effects of changes and fluctuations in refractivity of gas in the measurement path.

As illustrated in FIG. 6, beam 224 is reflected by mirror 344 as beam 324. Input beam 324 is incident on interferometer 310 comprising a dynamic beam steering element 372 and is reflected by dynamic beam steering element 372 as beam 326. The measurement beam component of beam 326 is transmitted by polarizing interface 236, polarization beam-splitter 374A, and quarter-wave phase retardation plate 376A as a component of measurement beam 328. The return component of measurement beam 328 is exits interferometer 310 as a measurement beam component of output beam 330 after being transmitted by quarter-wave phase retardation plate 376A, half-wave phase retardation plate 376B, and polarizing interface 236 and after being reflected by polarization beam-splitter 374A and mirror 374B. Quarter-wave phase retardation plate 376A is oriented to rotate the plane of polarization of a measurement beam by 90 degrees following a double pass through phase retardation plate 376A. Half-wave phase retardation plate 376B is oriented to rotate the plane of polarization of a measurement beam by 90 degrees following a single pass through phase retardation plate 376B.

The reference beam component of beam 326 is reflected twice by polarizing interface 236 and once by retroreflector 240 as a reference beam component of output beam 330.

A first portion of output beam 330 is reflected by non-polarization beam-splitter 378A as first output beam 332. A second portion of output beam 330 is transmitted by non-polarization beam-splitter 378A and a first portion thereof is reflected by analyzer 378B as a second output beam 334. A second portion of the second portion of output beam 330 transmitted by non-polarization beam-splitter 378A is transmitted by analyzer 378B as a third output beam 336. First output beam 332 is incident on angle interferometer 358, second output beam 334 is incident on differential angle interferometer 350, and third output beam is incident on detector 346.

Analyzer 378B comprises a polarization beam-splitter oriented to mix the reference beam and measurement beam components of reflected and transmitted beams 334 and 336. The direction of propagation of beam 334 is actually at an angle of 45 degrees to the plane of FIG. 6. However, for the purpose of simplifying the diagrammatic representation of the embodiments shown in FIG. 6 without compromising the description of important features, the orientation of analyzer 378B is shown in FIG. 6 as reflecting the second beam 334 in the plane of FIG. 6.

Interferometer 310 introduces phase shift $\phi_4$ between the measurement and reference beam components of beam 336 so that beam 336 is a phase-shifted beam. The magnitude of phase shift $\phi_4$ is related to round-trip physical lengths $2L_{M1}$ and $2L_{R1}$ of the measurement path and reference paths, respectively, and the index of refraction according to the formula $$\varphi_4 = 2k_1(L_{M4}n_{M4} - L_{R4}n_{R4}) \tag{12}$$

where $n_{M4}$ and $n_{R4}$ are the averages of the refractive index of a gas in the measurement and reference paths, respectively, corresponding to the optical paths introducing phase shift $\phi_4$.

Output beam 336 is a mixed beam and is detected by detector 346 to generate electrical interference signal or heterodyne signal 348. Detector 346 is preferably a quantum photon detector and heterodyne signal 348 contains as a heterodyne phase $\phi_4$.

Second output beam 334 is incident on angle displacement interferometer 350 that is shown diagrammatically in FIG. 6. Angle displacement interferometer 350 is differential angle displacement interferometer used to introduce a relative phase shift $\phi_5$ between the measurement and reference beam components of second output beam 334. Relative phase shift $\phi_5$ is related to the difference in the directions of propagation $\alpha_1$ of the measurement and reference beam components of second output beam 334 in the plane of FIG. 6. Relative phase shift $\phi_5$ is subsequently measured, compensated for effects of various changes and fluctuations in the gas, and used as an error signal in a servo control system that controls the orientation of dynamic beam steering element 372 such that angle $\alpha_1$ is controlled to a value substantially equal to zero.

Differential angle interferometer 350 comprises a beam shearing assembly in a differential angle interferometer such as described in commonly owned U.S. patent application Ser. No. 10/272,034 entitled "INTERFEROMETERS FOR MEASURING CHANGES IN OPTICAL BEAM DIRECTION" and filed Oct. 15, 2002 by Henry A. Hill, the contents of which are included in their entirety by way of reference.

Output beam 334 is a mixed beam and is detected by detector 350 to generate electrical interference signal or heterodyne signal 352. Detector 350 is preferably a quantum photon detector and heterodyne signal 352 contains as a heterodyne phase $\phi_5$.

First output beam 332 is incident on angle displacement interferometer 358 and generates electrical interference signal 360. Angle displacement interferometer 358 comprises beam-shearing assembly in an angle interferometer such as described in the cited patent application on angle interferometers by Henry A. Hill. Angle displacement interferometer 358 is a non-differential type angle displacement interferometer used to introduce a relative phase shift $\phi_6$ between the measurement and reference beam components of first output beam 332. Relative phase shift $\phi_6$ is related to a change in directions of propagation $\alpha_2$ of the measurement and reference beam components of third output beam 332. Phase shift $\phi_6$ is subsequently measured and used to determine angle $\alpha_2$. Electrical interference signal 360 contains phase information as a heterodyne phase $\phi_6$.

Analyzer 354 comprises a processor that extracts phase $\phi_5$ from heterodyne signal 352 by a phase meter using a reference phase from source 220. Analyzer 354 computes the difference in directions of propagation of the reference and measurement beam components of beam 334 and the measured angle difference is transmitted to servo controller 380 as signal 362 to generate servo control signal 382 and output signal 356. Servo control signal 382 is transmitted to transducers 370A and 370B that control the orientation of dynamic beam steering element 372 in the plane of FIG. 6. The effect of the servo control of dynamic beam steering element 372 is to servo the orientation of element 372 so that the difference in directions of propagation the reference and measurement beam components of beam 334 equal to zero. When the differential condition is met, i.e. the difference in directions of propagation the reference and measurement beam components of beam 334 are equal to zero and the direction of propagation of beam 328 is normal to the reflecting surface of object mirror 394.

Analyzer 354 further comprises a processor that extracts phase $\phi_6$ from heterodyne signal 360 by a phase meter using a reference phase from source 220. Next, analyzer 354 computes changes in direction of propagation of beam 332 from the measured phase $\phi_6$ compensated for effects of stationary non-random changes and certain effects of random fluctuations in refractivity of the gas.

It will be evident to one skilled in the art that additional angle interferometers can be added to the present interferometry system to measure the direction of propagation of beam 332 compensated for effects of various changes and fluctuations in refractivity of the gas in a plane orthogonal to the plane FIG. 6 without departing from the spirit and scope of the present invention. It will also be evident to one skilled in the art that other angle interferometers, such as described in cited references to commonly owned U.S. patent applications can be used and/or added to the interferometry system to measure the directions of propagation of beam 332 compensated for effects of changes and fluctuations in refractivity of the gas in one or two orthogonal planes.

Figure 7:
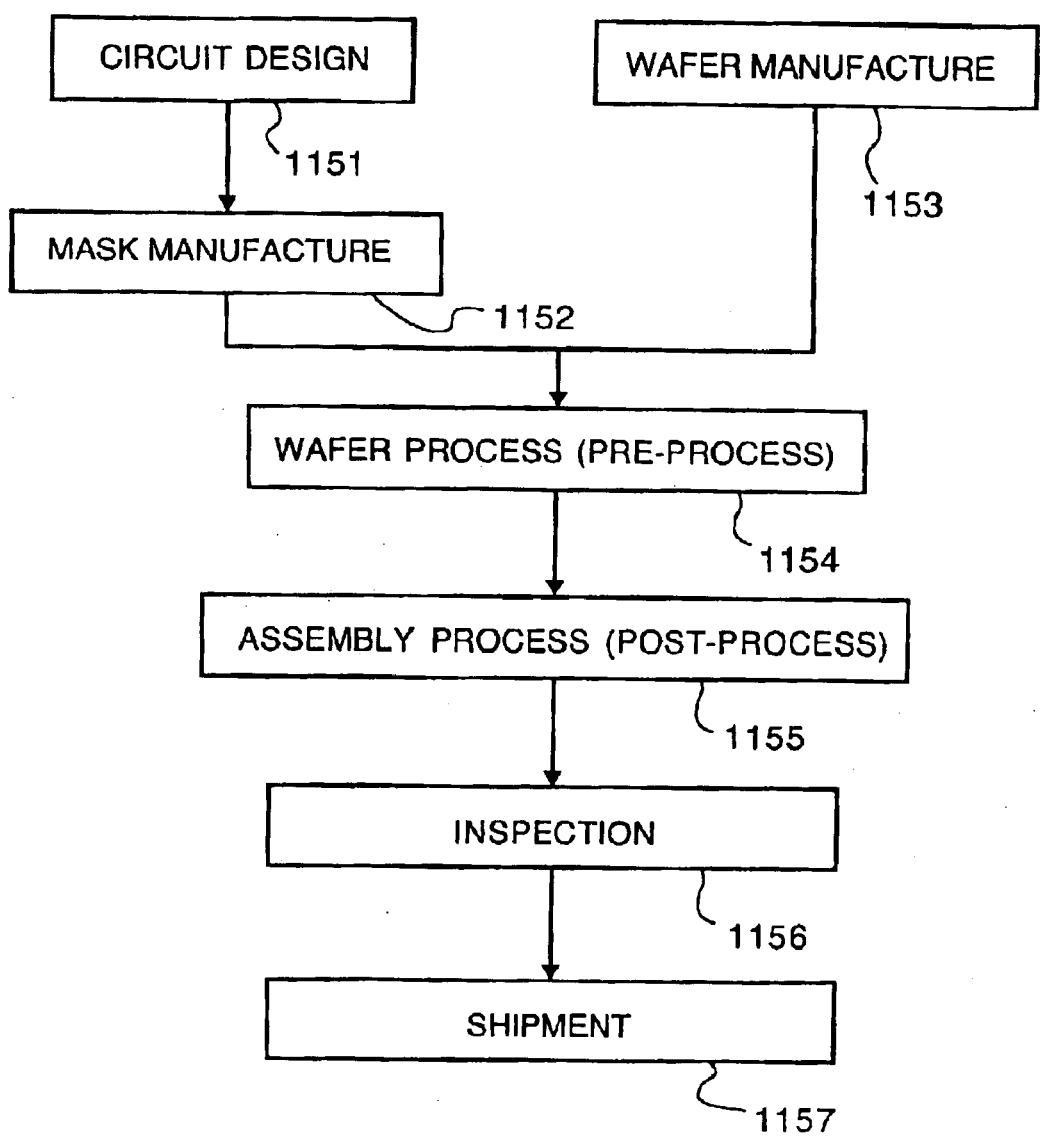
FIG. 7 is a flow chart showing stages of a semiconductor device manufacture.

As is well known in the art, lithography is a critical part of manufacturing methods for making semiconducting devices. For example, U.S. Pat. No. 5,483,343 outlines steps for such manufacturing methods. These steps are described below with reference to FIGS. 7 and 8. FIG. 7 is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 8:
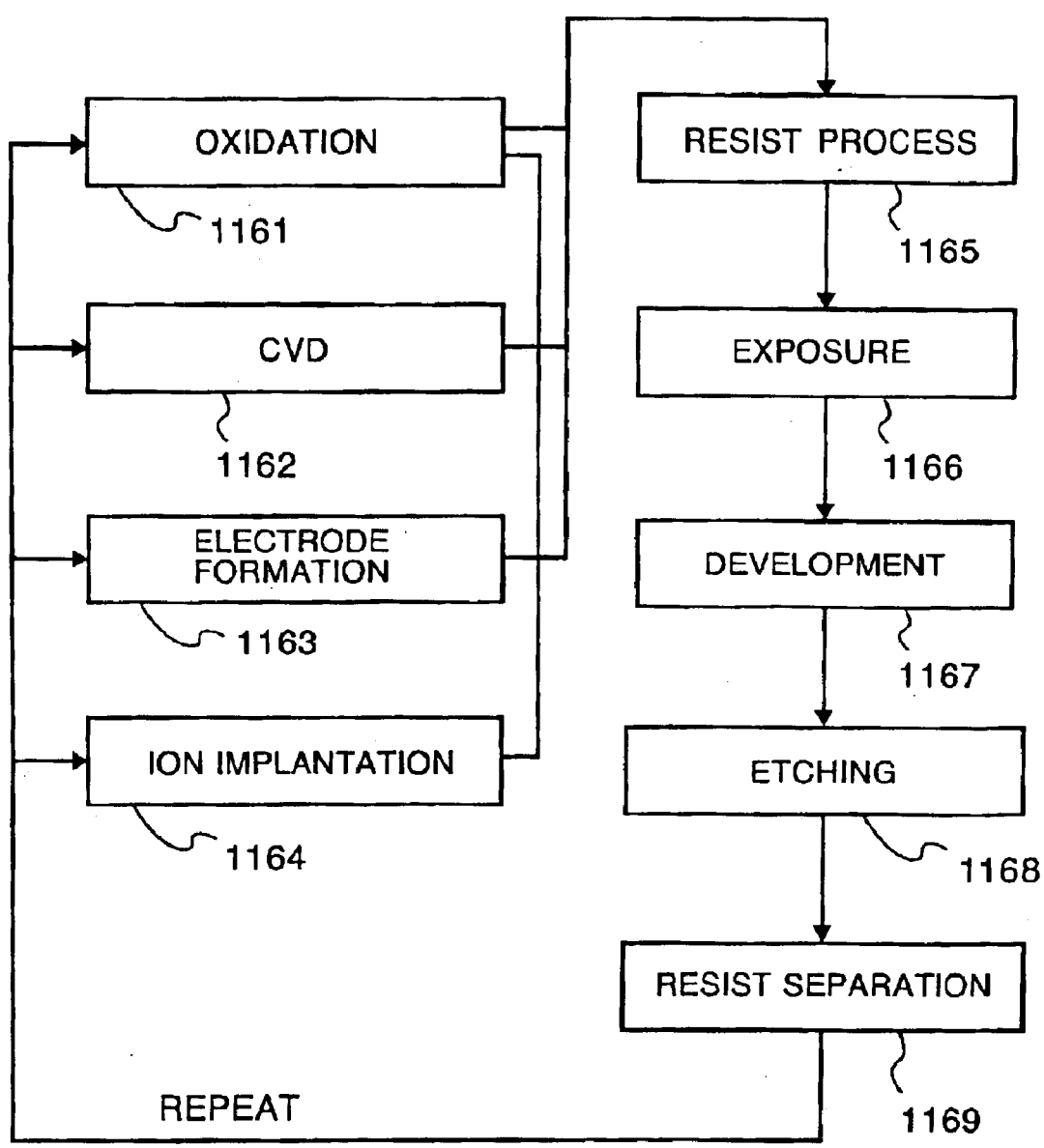
FIG. 8 is a flow chart showing details of the wafer process.

FIG. 8 is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 9:
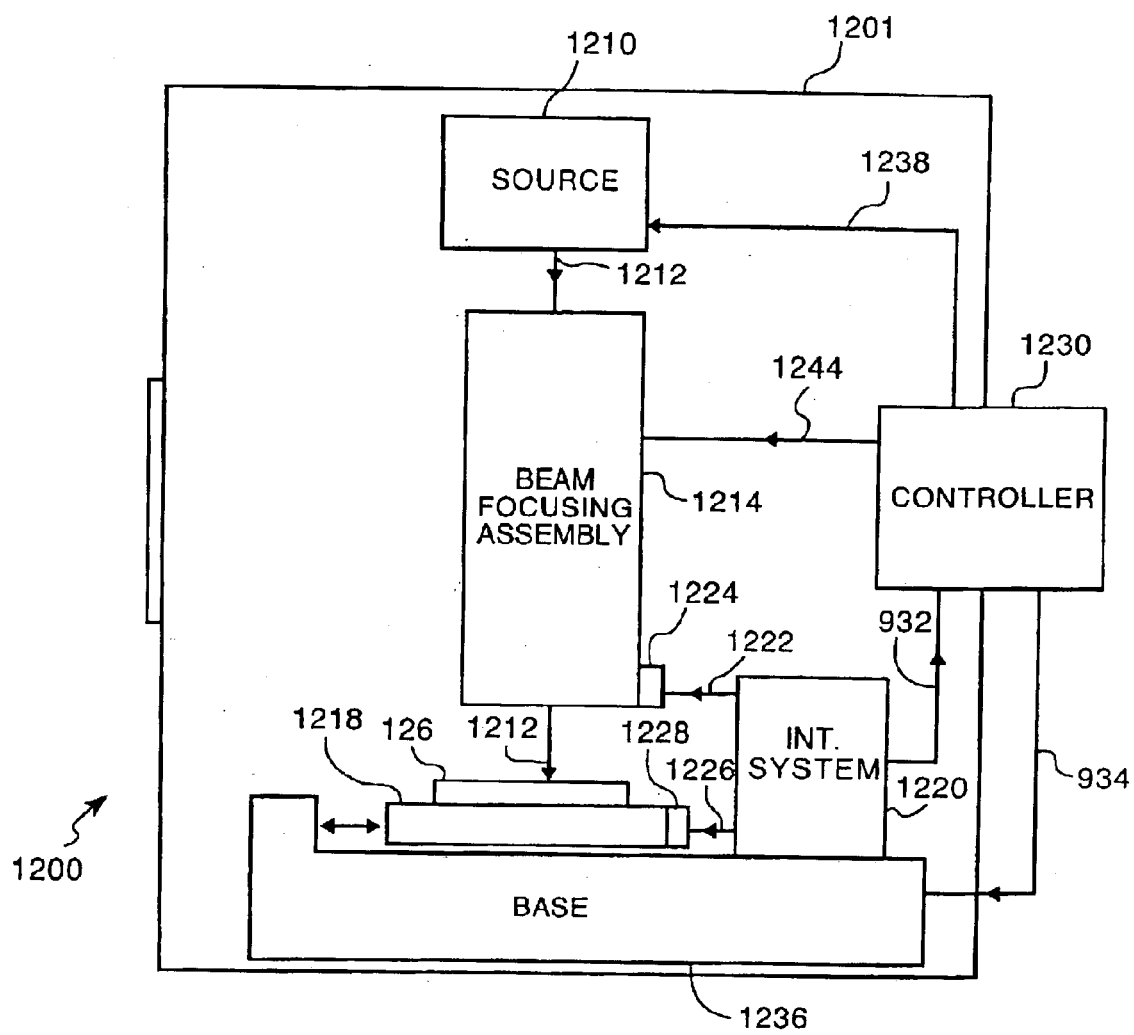
FIG. 9 is a schematic diagram of a beam writing system.

As an example, a schematic of a beam writing system 1200 is shown in FIG. 9. A chamber 1201 houses beam writing system 1200. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 932 to controller 1230 that is indicative of the relative position of write beam 1212 on substrate 1216. Controller 1230 sends an output signal 934 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate. Controller 1230 can be housed within chamber 1201, can be mounted on the outside of the chamber, or can be located at some location remote from chamber 1201.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. A method for use during a photolithography exposure cycle, the method comprising:
   interferometrically measuring a position of a movable stage within a chamber housing a photolithography exposure system;
   monitoring a refractivity at a location within the chamber remote from the interferometric measurement; and
   correcting the interferometric position measurement of the stage based on the monitored refractivity and a non-trivial function mapping refractivity at the remote location to that near the interferometric measurement during different stages of the photolithography exposure cycle.

2. The method of claim 1, wherein the photolithography exposure cycle causes atmospheric changes in the chamber.

3. The method of claim 2, further comprising repeating the interferometric position measurement during the atmospheric changes.

4. The method of claim 3, further comprising correcting the repeated interferometric position measurements based on the monitored refractivity at the first location and the non-trivial function.

5. The method of claim 1, further comprising moving the movable stage during the photolithography exposure cycle.

6. The method of claim 1, further comprising introducing a gas into or exhausting a gas out of the chamber during the photolithography exposure cycle.

7. The method of claim 1, further comprising loading a wafer onto the movable stage or removing a wafer from the movable stage during the photolithography exposure cycle.

8. The method of claim 1, wherein interferometrically measuring the position of the movable stage comprises directing a measurement beam between an interferometer and a measurement object, wherein at least one of the interferometer and the measurement object is attached to the movable stage.

9. The method of claim 1, wherein the non-trivial function is determined empirically or from a computer model.

10. The method of claim 8, further comprising measuring a wavelength of the measurement beam during the photolithography exposure cycle.

11. The method of claim 10, further comprising correcting the interferometric position measurement of the movable stage position based on the wavelength measurement.

12. A method, comprising:
   interferometrically measuring a position of a movable object within a chamber;
   measuring a refractivity at a first location within the chamber; and
   correcting the interferometric position measurement of the object based on the refractivity measurement at the first location and a non-trivial function mapping refractivity at the first location to that near the interferometry measurement.

13. The method of claim 12, wherein the chamber houses a photolithography exposure system.

14. The method of claim 13, wherein the movable object is a movable stage.

15. The method of claim 14, wherein the movable stage supports a wafer during the interferometric measurement.

16. The method of claim 14, wherein photolithography system supports a reticle during the interferometric measurement.

17. The method of claim 14, wherein interferometrically measuring the position of the movable stage comprises monitoring changes in an optical path length between an interferometer and a measurement object, wherein at least one of the interferometer and the measurement object is attached to the movable stage.

18. The method of claim 17, further comprising measuring a wavelength of a measurement beam directed between the interferometer and the measurement object during the interferometric measurement, and correcting the interferometric position measurement of the object based on the measured wavelength.

19. The method of claim 12, wherein the first location is remote from the interferometry measurement.

20. The method of claim 18, wherein the non-trivial function comprises a function that relates the refractivity of the atmosphere at the remote location to the refractivity of the atmosphere near the interferometry measurement during different stages of an exposure cycle of the photolithography system.

21. The method of claim 20, wherein the non-trivial function is determined empirically.

22. The method of claim 20, wherein the non-trivial function is determined from a computer model.

23. The method of claim 12, wherein the chamber houses a beam writing system.

24. A system, comprising:
   a chamber;
   a movable stage housed in the chamber;
   an interferometry system configured to measure a position of the movable stage along a measurement path, the interferometry system comprising a refractometer configured to monitor a refractivity at a first location within the chamber; and
   a controller coupled to the interferometry system, wherein during operation the controller corrects the interferometric position measurement based on the monitored refractivity at the first location and a non-trivial function mapping refractivity at the first location to that at the measurement path during different stages of a process cycle of the system.

25. The system of claim 24, further comprising a photolithography exposure system, the photolithography exposure system being housed in the chamber.

26. The system of claim 25, wherein the photolithography exposure system comprises an illumination source and during operation of the system the movable stage positions a wafer relative to the illumination source.

27. The system of claim 26, further comprising a wafer feeding system configured to position wafers on the movable stage or remove wafers from the movable stage.

28. The system of claim 24, further comprising a beam writing system, the beam writing system being housed in the chamber.

29. The system of claim 28, wherein the beam writing system comprises a beam source and during operation of the system the movable stage positions a wafer relative to the beam source.

30. The system of claim 24, further comprising a gas inlet configured to introduce gas into the chamber.

31. The system of claim 24, further comprising a gas exhaust configured to exhaust gas out of the chamber.

32. The system of claim 24, wherein the interferometry system comprises an interferometer configured to accept an input beam from a source and to derive a measurement beam from the input beam.

33. The system of claim 32, wherein the interferometry system further comprises a wavelength monitor, the wavelength monitor being configured to monitor the wavelength of the measurement beam.

34. The system of claim 33, wherein the wavelength monitor is configured to interferometrically monitor the wavelength of the measurement beam.

35. The system of claim 32, wherein the interferometry system further comprises an angle displacement interferometer.

36. The system of claim 35, wherein the interferometry system further comprises a dynamic element adapted to adjust the direction of the input beam in response to a signal from the angle displacement interferometer.

37. The system of claim 32, wherein the interferometer is a heterodyne interferometer.

38. The system of claim 32, wherein the interferometer is a homodyne interferometer.

39. The system of claim 32, wherein the interferometry system further comprises a measurement object, and at least one of the interferometer and the measurement object are attached to the movable stage.

40. The system of claim 24, wherein the first location is remote from the measurement path.

* * * * *